United States Patent
Tang et al.

(10) Patent No.: US 11,095,301 B1
(45) Date of Patent: Aug. 17, 2021

(54) FLASH-SUCCESSIVE APPROXIMATION REGISTER (SAR) HYBRID ANALOG-TO-DIGITAL CONVERTER (ADC)

(71) Applicant: QUALCOMM Incorporated, San Diego, CA (US)

(72) Inventors: Yongjian Tang, San Diego, CA (US); Chieh-Yu Hsieh, Irvine, CA (US); Lei Sun, San Diego, CA (US); Anand Meruva, San Diego, CA (US); Seyed Arash Mirhaj, San Diego, CA (US); Yuhua Guo, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/945,090

(22) Filed: Jul. 31, 2020

(51) Int. Cl.
H03M 1/12 (2006.01)
H03M 1/10 (2006.01)
H03M 1/06 (2006.01)
H03M 1/00 (2006.01)

(52) U.S. Cl.
CPC ............ *H03M 1/1014* (2013.01); *H03M 1/00* (2013.01); *H03M 1/06* (2013.01); *H03M 1/10* (2013.01); *H03M 1/12* (2013.01)

(58) Field of Classification Search
CPC ............ H03M 1/12; H03M 1/10; H03M 1/06; H03M 1/00
USPC .................. 341/155, 120, 118, 156, 126, 161
See application file for complete search history.

(56) References Cited

U.S. PATENT DOCUMENTS

| | | | | |
|---|---|---|---|---|
| 2011/0012519 A1* | 1/2011 | Zhao | ...................... | H05B 45/46 315/185 R |
| 2012/0154193 A1* | 6/2012 | Chang | ................... | H03M 1/145 341/156 |
| 2015/0009059 A1* | 1/2015 | Chen | ..................... | H03M 1/187 341/155 |

* cited by examiner

*Primary Examiner* — Joseph J Lauture
(74) *Attorney, Agent, or Firm* — Patterson+Sheridan, L.L.P.

(57) ABSTRACT

Certain aspects provide a circuit for analog-to-digital conversion. The circuit generally includes a flash analog-to-digital converter (ADC) having a plurality of comparators, each comparator being configured to compare an input voltage to a reference voltage; and a calibration circuit coupled to the flash ADC and configured to tune the reference voltage prior to a conversion operation by the flash ADC.

20 Claims, 5 Drawing Sheets

FLASH-SUCCESSIVE APPROXIMATION REGISTER (SAR) HYBRID ANALOG-TO-DIGITAL CONVERTER (ADC)

TECHNICAL FIELD

Certain aspects of the present disclosure generally relate to electronic circuits and, more particularly, to an analog-to-digital converter (ADC).

BACKGROUND

Many electronic devices include one or more analog-to-digital converters (ADCs), for converting analog signals to digital signals for additional processing in the digital domain. Several types of ADCs are available, each with varying advantages and disadvantages. For example, a successive approximation register (SAR) ADC may provide an area and power-efficient architecture for low to medium accuracy analog-to-digital conversion applications. A SAR ADC may use a comparator and logic to approximate a digital value corresponding to an analog input. Another type of ADC is referred to as a flash ADC, which may provide a faster conversion speed at the cost of an exponential increase in power and area consumption, compared to a SAR ADC, for example.

SUMMARY

Certain aspects of the present disclosure generally relate to a flash-successive approximation register (SAR) hybrid analog-to-digital converter (ADC).

Certain aspects provide a circuit for analog-to-digital conversion. The circuit generally includes: a flash analog-to-digital converter (ADC) having a plurality of comparators, each comparator being configured to compare an input voltage to a reference voltage; and a calibration circuit coupled to the flash ADC and configured to tune the reference voltage prior to a conversion operation by the flash ADC.

Certain aspects provide a method for analog-to-digital conversion. The method generally includes: tuning, via a calibration circuit, a reference voltage for each of a plurality of comparators of a flash ADC; and performing, via the flash ADC coupled to the calibration circuit, the analog-to-digital conversion after the tuning of the reference voltage, the analog-to-digital conversion being performed by comparing an input voltage to the reference voltage by each of the plurality of comparators.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure generally relate to a flash-successive approximation register (SAR) hybrid analog-to-digital converter (ADC). In some cases, a calibration circuit may be used to tune a reference voltage of comparators of the flash ADC to reduce errors associated with the flash ADC in the hybrid ADC.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
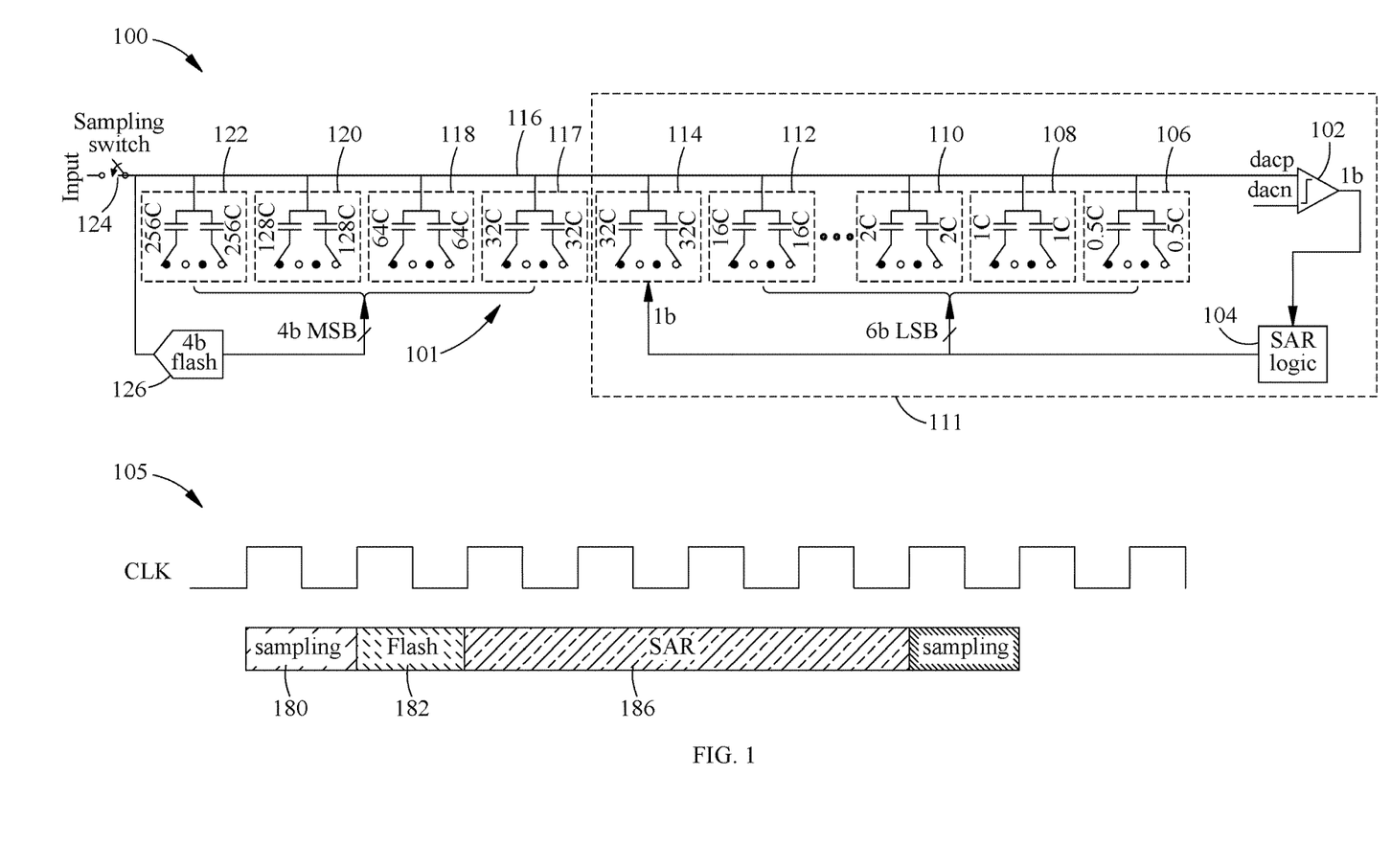
FIG. 1 illustrates an example flash-successive approximation register (SAR) hybrid analog-to-digital converter (ADC) and an associated timing diagram, in accordance with certain aspects of the present disclosure.

FIG. 1 illustrates an example hybrid flash-SAR ADC 100 and an associated timing diagram 105, in accordance with certain aspects of the present disclosure. Fifth-generation (5G) millimeter wave wireless communication uses wideband, high dynamic-range ADCs. A hybrid flash-SAR ADC is a suitable candidate for such an application. In a flash-SAR ADC, a flash ADC first resolves the most significant bits (MSBs) of a digital output using a parallel conversion technique to achieve fast conversion speed. Then a SAR ADC resolves the least significant bits (LSBs) sequentially in a more power efficient manner. Therefore, combining the flash and SAR architectures achieves a good balance between speed, area consumption, and power.

The example flash-SAR ADC 100 is a 10-bit ADC. As illustrated, the flash-SAR ADC 100 may include a 4-bit (4b) flash ADC 126 having an input coupled to a sampling node 116. While the example flash-SAR ADC 100 is implemented as a 10-bit flash-SAR ADC having a 4-bit flash ADC, the aspects described herein may be implemented for a flash-SAR ADC and a flash ADC implemented with any number of bits. The sampling node 116 may be selectively coupled to an input via switch 124 for sampling an input voltage for conversion. For example, during a first clock period (e.g., of a clock signal (CLK)), there may be a sampling phase 180 where the sampling switch 124 is closed and the input voltage is sampled on the top plate (e.g., at sampling node 116) of the capacitor array 101 (e.g., including capacitive elements 106, 108, 110, 112, 114, 117, 118, 120, 122 and which may also be referred to as a "capacitive array") once the sampling switch is open. During the sampling phase 180, the bottom plate of half of the capacitive elements of the capacitor array 101 is connected to a positive reference voltage node (Vrefp), and the other half may be connected to a negative reference voltage node (Vrefn).

After the sampling phase 180, the flash ADC 126 may be enabled during a flash phase 182, and produces a 4-bit digital signal according to the sampled voltage and a reference voltage of the flash ADC 126. The capacitor array 101 may be controlled based on the 4-bit digital signal, and a voltage is produced at the top plate of the capacitor array 101 to be processed by a SAR ADC 111.

The SAR ADC is then enabled and uses a 1-bit comparator (e.g., comparator 102) to digitize the remaining bits (e.g., 6 bits) to be provided as a digital output of the hybrid flash-SAR ADC 100, during a SAR conversion phase 186. For example, the SAR ADC includes a comparator 102, having an output coupled to SAR logic 104, which controls switches for selectively coupling each of the capacitive elements 106, 108, 110, 112, 114 to Vrefp and Vrefn. The capacitor array 101 in effect acts as a digital-to-analog converter (DAC), allowing the SAR logic 104 to successively approximate a digital representation of the voltage at the sampling node 116 based on the output of the comparator 102.

Errors may be generated due to the hybrid implementation of the ADC, from such factors as the flash ADC comparator offset and the gain mismatch between the flash and SAR ADCs. A redundancy bit may be used to correct for such an error. However, when the errors are large, either more redundancy bits are to be implemented, which slows down the ADC speed, or more area and power are used. For example, capacitive elements 114 may be used to implement a redundancy bit for the SAR ADC to correct for any error associated with the conversion by the flash ADC 126 due to non-idealities. If the error is larger than the redundancy range, the error from the flash ADC may not be capable of being corrected, and the ADC performance will be degraded. In some cases, the flash ADC may be implemented as a 3-bit ADC in order for the redundancy range to be increased. However, this solution slows down the ADC speed. In other cases, the error associated with the flash ADC 126 may be reduced. But doing so may result in greater power consumption and semiconductor die area associated with the flash ADC 126. Certain aspects of the present disclosure are directed to techniques for calibrating the flash ADC 126 to reduce the errors in the flash ADC.

Figure 2:
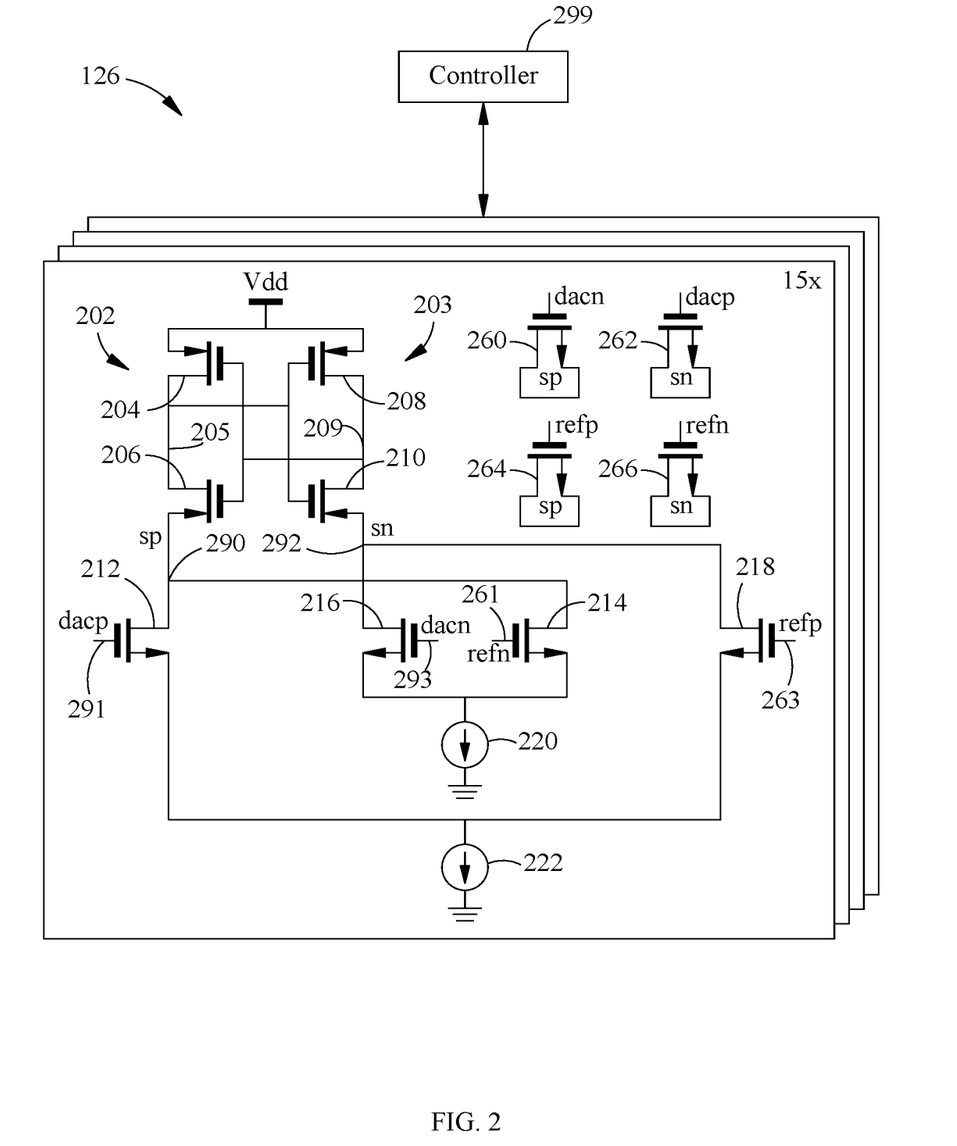
FIG. 2 is a circuit diagram of example comparators used to implement a flash ADC, in accordance with certain aspects of the present disclosure.

FIG. 2 is a circuit diagram of example comparators used to implement the flash ADC 126, in accordance with certain aspects of the present disclosure. As illustrated, the flash ADC 126 may include 15 comparators, allowing for the flash ADC 126 to generate a 4-bit digital signal. Each of the comparators may include inverters 202, 203. For example, an inverter 202 coupled to voltage rail Vdd may be implemented using a p-type metal-oxide-semiconductor (PMOS) transistor 204, and an n-type metal-oxide-semiconductor (NMOS) transistor 206, and another inverter 203 may be implemented using PMOS transistor 208 and an NMOS transistor 210. The drains of transistors 204, 206 are coupled to a negative output (Outn) 205 of the comparator, and the drains of transistors 208, 210 are coupled to a positive output (Outp) 209 of the comparator. As illustrated, the output 205 is coupled to an input of the inverter 203, and the output 209 is coupled to an input of the inverter 202.

The source of transistor 206 may be coupled to NMOS transistor 212 having a gate coupled to node 291 and controlled via a positive DAC (dacp) signal (e.g., also referred to as a positive input voltage signal) and an NMOS transistor 214 having a gate coupled to node 161 and controlled via a negative reference (refn) signal. Moreover, the source of transistor 210 may be coupled to the NMOS transistor 216 having a gate coupled to node 293 and controlled via a negative DAC (dacn) signal (e.g., also referred to as a negative input voltage signal) and to the NMOS transistor 218 having a gate coupled to node 263 and controlled via a positive reference (refp) signal. The dacp and dacn signals may be a pair of signal components of a differential input voltage, and the refp and refn signals may be a pair of signal components of a differential reference voltage pair. The drains of transistors 291, 214 are coupled to node 290 (labeled "sp"), and the drains of transistors 293, 263 are coupled to node 292 (labeled "sn").

In certain aspects, the refn and refp signals may be set to calibrate the comparators of the flash ADC 126. In other words, in order to calibrate the error of the flash comparators, each flash comparator's reference signal may be made tunable. As illustrated, a current source 220 may be configured to sink a current from sources of transistors 216, 214, and a current source 222 may be configured to sink a current from sources of transistors 212, 218. As illustrated, the comparators of the flash ADC 126 may be implemented using dummy transistors 260, 262, 264, 266, as described in more detail herein.

Figure 3:
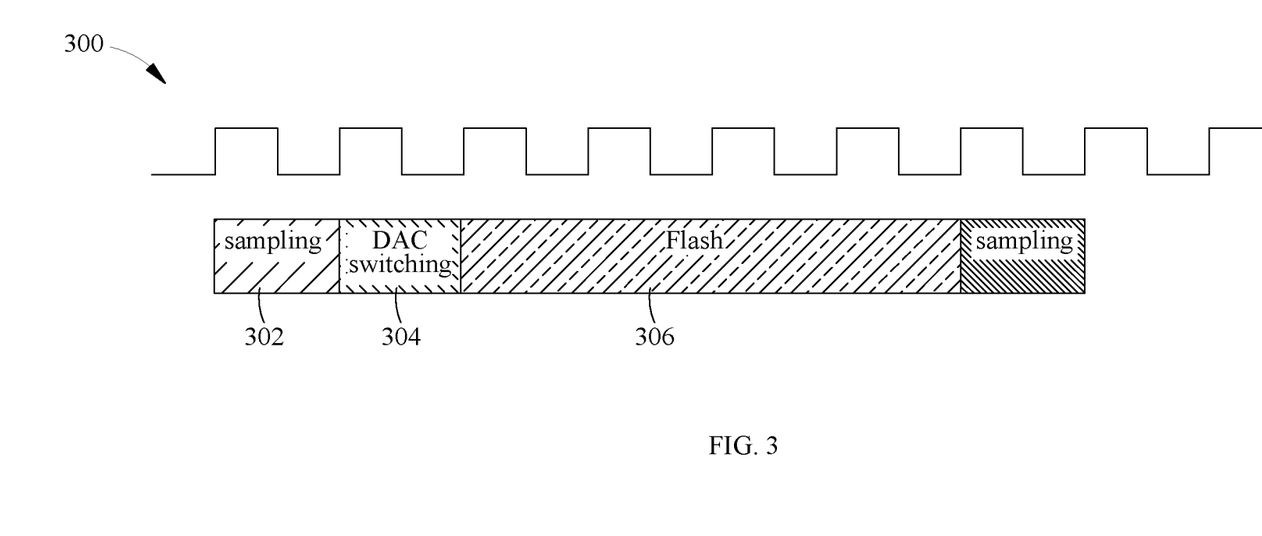
FIG. 3 is a timing diagram illustrating different phases for calibrating comparators of a flash ADC while in a flash calibration mode, in accordance with certain aspects of the present disclosure.

FIG. 3 is a timing diagram 300 illustrating different phases for calibrating the comparators of the flash ADC 126 while in a flash calibration mode, in accordance with certain aspects of the present disclosure. The hybrid ADC 100 may be configured in a flash calibration mode of operation prior to analog-to-digital conversion operations. For example, during a sampling phase 302, a zero input voltage may be applied to the hybrid ADC input, and sampled at sampling node 116. During a DAC switching phase 304, the capacitor array 101 may be used as a switched-capacitor DAC to generate a desired threshold for a flash comparator to be calibrated. Each comparator may be configured to have a trigger threshold, such that when an input voltage to the comparator reaches the trigger threshold, the output of the comparator transitions from one logic state to another logic state. In certain aspects, the voltage at the sampling node 116 may be set to a trigger threshold (also referred to as a "trip point") of the comparator. For instance, to calibrate the seventh comparator out of the 15 comparators of the flash ADC 126, the capacitive elements 122 may be controlled to generate a voltage that is equal to half of the ADC full-scale voltage. Then, the reference for the comparator is tuned so that the comparator's output is at a trip point of the comparator. For example, during the flash phase 306, the flash comparator may be operated to generate a comparator output multiple times (e.g., 10 times). The comparator output may be monitored (e.g., via controller 299), expecting that an equal number of logic high and logic low outputs are generated since the sampling node 116 is set to the trip point of the comparator. If there are a greater number of logic high outputs from the comparator, the differential reference voltage may be increased, and vice versa. These steps may be repeated until all the comparators of the flash ADC are calibrated.

Figure 4:
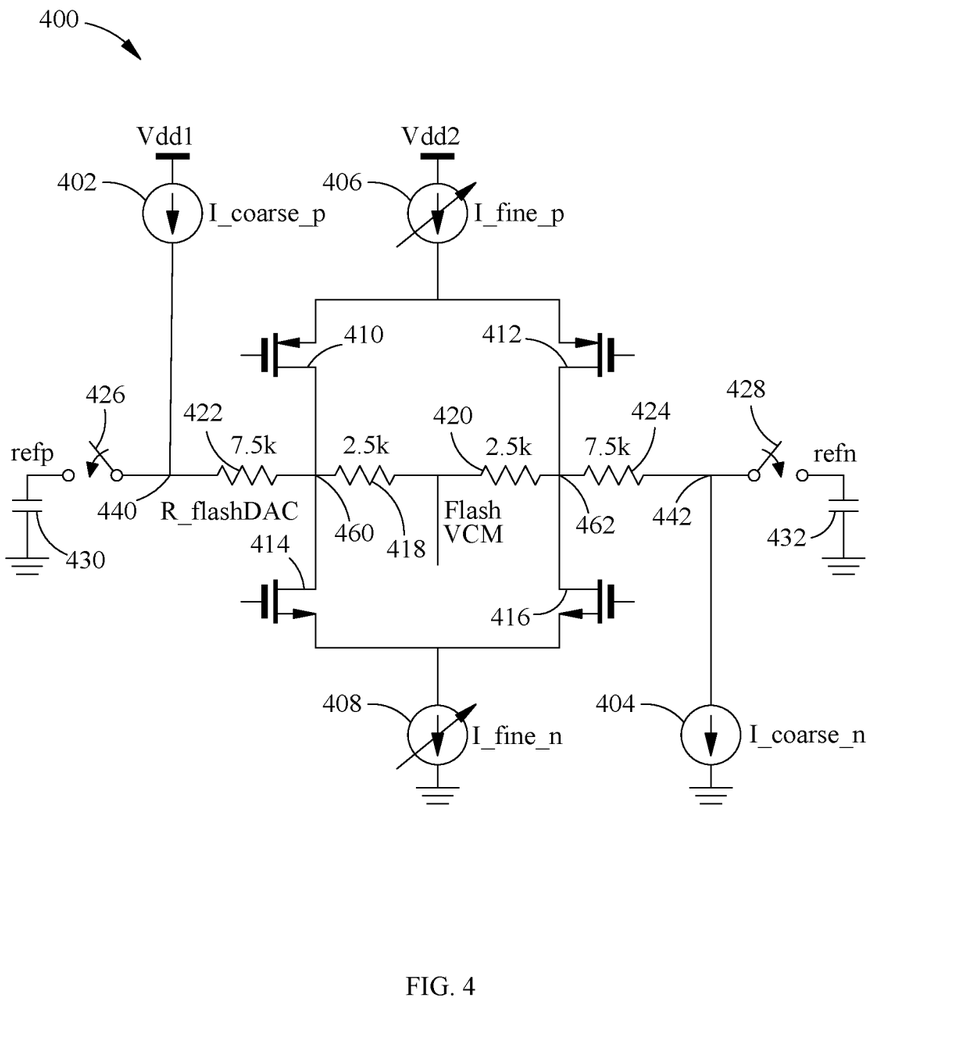
FIG. 4 illustrates a calibration circuit for setting reference voltage signals for the hybrid ADC, in accordance with certain aspects of the present disclosure.

FIG. 4 illustrates a calibration circuit 400 for setting the refp and refn signals, in accordance with certain aspects of the present disclosure. As illustrated, the calibration circuit 400 includes a current source 402 (also referred to herein as "coarse current source") coupled to voltage rail VDD1 sourcing a coarse tuning current (I_coarse_p), and a current source 404 (also referred to herein as a "coarse current source") sinking a coarse tuning current (I_coarse_n). The current sources 402, 404 generate a current flow sourced from the current source 402, flowing across resistive elements 422, 418, 420, 424, and sunk by the current source 404. As illustrated, the node between the resistive elements 418, 420 is the common-mode voltage (VCM) node of the flash ADC.

As illustrated, the calibration circuit 400 also includes a current source 406 (also referred to herein as a "fine current source") coupled to a voltage rail VDD2 sourcing a fine-tuning current (I_fine_p), and a current source 408 (also referred to herein as a "fine current source") sinking a fine-tuning current (I_fine_n). In some aspects, the voltage associated with VDD2 may be less than the voltage associated with VDD1. The calibration circuit 400 also includes transistors 410, 412, 414, 416. If transistors 410, 416 are on and transistors 412, 414 are off, the current sourced by the current source 406 flows through transistor 410, through resistive elements 418, 420, and through transistor 416. In this case, the current flow across the resistive elements 418, 420 is the sum of the currents from the current sources 402, 406, resulting in an increase of the voltage difference between nodes 460, 462. Therefore, the voltage difference between nodes 460, 462 and the voltage difference between nodes 440, 442 may be set (increased).

As illustrated, the calibration circuit 400 includes a capacitive element 430 coupled between electric ground (e.g., a reference potential node) and a node providing the refp signal, and a capacitive element 432 coupled between electric ground and a node providing the refn signal. The switches 426, 428 may be closed (e.g., via control signals from controller 299) to set the voltage across capacitive elements 430, 432 by sampling the voltages at respective nodes 440, 442, in effect setting the refp and refn signals to calibrate the associated comparator of the flash ADC.

If transistors 412, 414 are on and transistors 410, 416 are off, the current sourced by the current source 406 flows through transistor 412, through resistive elements 420, 418, and through transistor 414. In this case, the current flow across the resistive elements 420, 418 is the difference between the currents from the current sources 402, 406, resulting in a decrease of the voltage difference between nodes 460, 462. Therefore, the voltage difference between nodes 460, 462 and the voltage difference between nodes 440, 442 may be set (decreased), followed by the closing of switches 426, 428 to set the refp and refn voltages for the associated comparator of the flash ADC. For example, after monitoring the output of the comparator, the controller 299 may either turn on transistors 410, 416 to increase the refp voltage, or turn on transistors 412, 414 to decrease the refp voltage to calibrate the comparator.

Certain aspects of the present disclosure provide techniques for reducing comparator kickback. Comparator kickback generally refers to impact to the comparator input (e.g., dacp signal) due to a change in voltage at the comparator internal node (e.g., sp signal). For example, referring back to FIG. 2, a change in voltage at node 290 may impact the dacp signal due to the parasitic capacitance between the drain and gate ($C_{gd}$) of transistor 212, degrading the performance of the comparator.

As illustrated in FIG. 2, the flash comparator has two differential inputs, one being for a dacp signal (e.g. a positive voltage component of a differential input voltage) and a dacn signal (e.g., a negative voltage component of the differential input voltage), and the other being for a refp signal (e.g., a positive voltage component of a differential reference voltage) and a refn signal (e.g., a negative voltage component of the differential reference voltage).

While the flash ADC is performing analog-to-digital conversion, the voltages at the nodes 290, 292 change differently because the nodes 290, 292 are dependent on corresponding comparator input signals (namely, the dacp, dacn, refp, and refn signals). In other words, a change in the voltage at the node 290 may impact the dacp signal, but not the dacn signal, causing a differential voltage between the dacp and dacn signals, adversely impacting comparator performance. In some aspects, dummy transistors may be implemented so that the nodes 290, 292 are equivalently coupled to the four input nodes. For example, an NMOS transistor 260 may be implemented with a gate coupled to the dacn node 293, where the source and drain of the transistor 260 are coupled to the node 290. Moreover, an NMOS transistor 262 may be implemented with a gate coupled to the dacp node 291, where the source and drain of the transistor 262 are coupled to the node 292. An NMOS transistor 264 may be implemented with a gate coupled to the refp node 263, where the source and drain of the transistor 264 are coupled to the node 290. An NMOS transistor 266 may be implemented with a gate coupled to the refn node 261, where the source and drain of the transistor 266 are coupled to the node 292. In this manner, the voltage at the input nodes due to kickback is in the form of a common-mode voltage (instead of a differential voltage), improving the performance of the comparator.

Moreover, as described with respect to FIG. 4, a sampled flash reference may be used to set the refp and refn voltages for each of the flash comparators. For example, the switches 426, 428 may be closed to set the voltage across the capacitive elements 430, 432, and open otherwise. The capacitance of each of the capacitive elements in corresponding flash comparators may be set to be ¹⁄₁₅th the total capacitor DAC (CDAC) value (e.g., since the total quantity of the comparators of the flash ADC is 15 in this example). For example, the total CDAC capacitance (e.g., the total capacitance associated with the capacitor array) may be 1024 C (e.g., $2^{10}$ C because the flash-SAR ADC is a 10-bit ADC), C being a reference capacitance value. Thus, the capacitance of each of the capacitive elements 430, 432 may be set to 1024 C/15. In this manner, the impedance at each of the gates of transistors 212, 214, 216, 218 is the same (within component tolerances). With both the implementation of dummy transistors and the sampled flash reference scheme, the comparator kickback becomes an equal common-mode kickback (as opposed to a differential-mode kickback) on all four input nodes (namely, nodes 291, 293, 261, 263), improving comparator performance as compared to conventional implementations.

Figure 5:
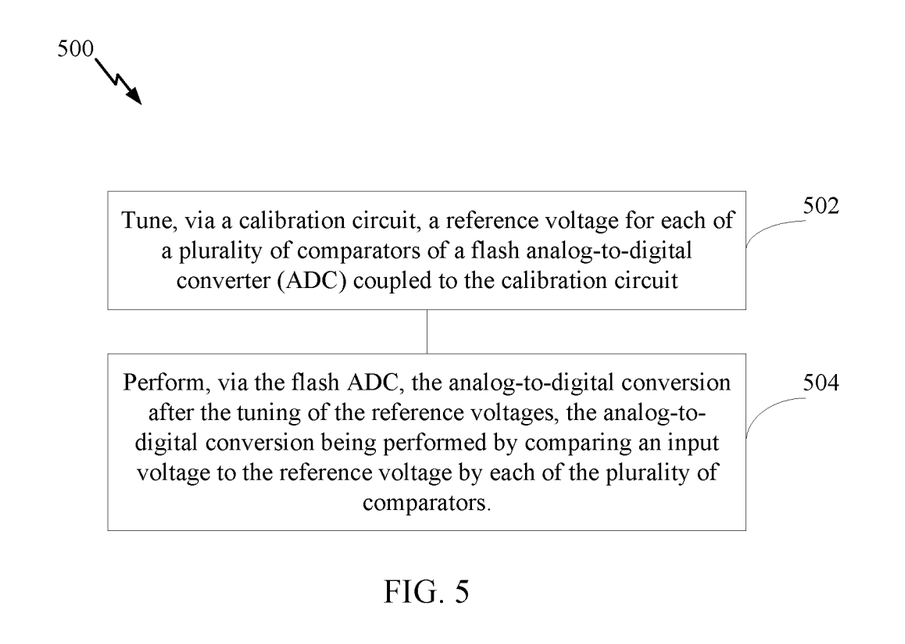
FIG. 5 is a flow diagram of example operations for analog-to-digital conversion, in accordance with certain aspects of the present disclosure.

FIG. 5 is a flow diagram of example operations 500 for analog-to-digital conversion, in accordance with certain aspects of the present disclosure. The operations 500 may be performed by an ADC system including an ADC and calibration circuit, such as the flash-SAR ADC 100 and calibration circuit 400.

The operations 500 may begin, at block 502, with the ADC system tuning, via a calibration circuit (e.g., calibration circuit 400), a reference voltage (e.g., refp signal) for each of a plurality of comparators of a flash ADC (e.g., flash ADC 126) coupled to the calibration circuit. At block 504 after the tuning of the reference voltages, the ADC system may perform, via the flash ADC, the analog-to-digital conversion, the analog-to-digital conversion being performed by comparing an input voltage (e.g., a voltage at sampling node 116) to the reference voltage by each of the plurality of comparators. For example, the ADC system may set the input voltage to a trigger point of the comparator, and perform, via the comparator, multiple comparisons of the input signal with the reference voltage. The tuning of the reference voltage may be based on results of the multiple comparisons.

The various operations of methods described above may be performed by any suitable means capable of performing the corresponding functions. The means may include various hardware and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. In addition, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for analog-to-digital conversion, comprising:
   a flash analog-to-digital converter (ADC) having a plurality of comparators, each comparator being configured to compare an input voltage to a reference voltage; and
   a calibration circuit coupled to the flash ADC and configured to tune the reference voltage prior to a conversion operation by the flash ADC, wherein the calibration circuit comprises:
   a first resistive element;
   a second resistive element;
   a first coarse current source coupled to a first terminal of the first resistive element; and
   a first fine current source selectively coupled to a second terminal of the first resistive element, the second terminal of the first resistive element being further coupled to a first terminal of the second resistive element, wherein a second terminal of the second resistive element is coupled to a common-mode voltage (VCM) node of the flash ADC.

2. The circuit of claim 1, wherein the flash ADC is configured to:
   set the input voltage to a trigger point of the comparator; and
   perform multiple comparisons of the input voltage with the reference voltage, wherein the calibration circuit is configured to tune the reference voltage based on results of the multiple comparisons.

3. The circuit of claim 2, wherein the calibration circuit is further configured to:
   increase the reference voltage if more than half of the results of the multiple comparisons are logic high; and
   decrease the reference voltage if less than half of the results of the multiple comparisons are logic high.

4. The circuit of claim 2, further comprising a capacitor array coupled to an input node of the ADC, wherein the flash ADC is configured to control the capacitor array to set the input voltage.

5. The circuit of claim 1, wherein the calibration circuit further comprises a switch coupled between the first fine current source and the second terminal of the first resistive element.

6. The circuit of claim 1, wherein the calibration circuit further comprises:
   a third resistive element;
   a fourth resistive element;
   a second coarse current source coupled to a first terminal of the third resistive element; and
   a second fine current source selectively coupled to a second terminal of the third resistive element, the second terminal of the third resistive element being further coupled to a first terminal of the fourth resistive element, and wherein a second terminal of the fourth resistive element is coupled to the VCM node of the flash ADC.

7. The circuit of claim 6, wherein the calibration circuit further comprises:
a first switch coupled between the first fine current source and the second terminal of the first resistive element;
a second switch coupled between the second fine current source and the second terminal of the first resistive element;
a third switch coupled between the first fine current source and the second terminal of the third resistive element; and
a fourth switch coupled between the second fine current source and the second terminal of the third resistive element.

8. The circuit of claim 1, wherein the calibration circuit further comprises:
a capacitive element coupled to a reference voltage node configured to provide the reference voltage for the comparator; and
a switch coupled between the first terminal of the first resistive element and the reference voltage node.

9. The circuit of claim 8, wherein the calibration circuit is further configured to sample a voltage at the first terminal of the first resistive element and to set the reference voltage by closing the switch.

10. The circuit of claim 8, further comprising a capacitor array coupled to an output of the flash ADC, wherein a capacitance of the capacitive element is equal to a total capacitance associated with the capacitor array divided by a total quantity of the comparators.

11. The circuit of claim 1, further comprising a successive approximation register (SAR) ADC configured to generate one or more least significant bits of a digital output of the circuit, wherein the flash ADC is configured to generate one or more most significant bits of the digital output.

12. The circuit of claim 11, further comprising a capacitor array, wherein the flash ADC is configured to selectively couple each of one or more capacitive elements of the capacitor array to a voltage rail or a reference potential node.

13. The circuit of claim 12, wherein the SAR ADC comprises a comparator and SAR logic, the SAR logic being configured to selectively couple each of one or more other capacitive elements of the capacitor array to the voltage rail or the reference potential node.

14. The circuit of claim 1, wherein the reference voltage comprises a differential reference voltage, and wherein the input voltage comprises a differential input voltage, the comparator comprising:
a first transistor having a drain coupled to an output of the comparator and a gate configured to receive a positive voltage of the differential input voltage;
a second transistor having a drain coupled to another output of the comparator and a gate configured to receive a negative voltage of the differential input voltage;
a third transistor having a drain coupled to the output of the comparator and a gate configured to receive a negative voltage of the differential reference voltage; and
a fourth transistor having a drain coupled to the other output of the comparator and a gate configured to receive a positive voltage of the differential reference voltage.

15. A circuit for analog-to-digital conversion, comprising:
a flash analog-to-digital converter (ADC) having a plurality of comparators, each comparator being configured to compare an input voltage to a reference voltage; and
a calibration circuit coupled to the flash ADC and configured to tune the reference voltage prior to a conversion operation by the flash ADC, wherein the reference voltage comprises a differential reference voltage, and wherein the input voltage comprises a differential input voltage, the comparator comprising:
a first transistor having a drain coupled to an output of the comparator and a gate configured to receive a positive voltage of the differential input voltage;
a second transistor having a drain coupled to another output of the comparator and a gate configured to receive a negative voltage of the differential input voltage;
a third transistor having a drain coupled to the output of the comparator and a gate configured to receive a negative voltage of the differential reference voltage; and
a fourth transistor having a drain coupled to the other output of the comparator and a gate configured to receive a positive voltage of the differential reference voltage.

16. The circuit of claim 15, wherein the comparator further comprises:
a first inverter having transistors coupled between a voltage rail and the drain of the first transistor; and
a second inverter having transistors coupled between the voltage rail and the drain of the second transistor, wherein drains of the transistors of the first inverter are coupled to the output of the comparator, wherein drains of the transistors of the second inverter are coupled to the other output of the comparator, wherein the second inverter has an input coupled to the output of the comparator, and wherein an input of the first inverter is coupled to the other output of the comparator.

17. The circuit of claim 15, wherein the comparator further comprises:
a first current source coupled to sources of the first transistor and the fourth transistor; and
a second current source coupled to sources of the second transistor and the third transistor.

18. The circuit of claim 15, further comprising:
a fifth transistor having a gate configured to receive the positive voltage of the differential input voltage, wherein a source and a drain of the fifth transistor are coupled to the drain of the second transistor;
a sixth transistor having a gate configured to receive the negative voltage of the differential input voltage, wherein a source and a drain of the sixth transistor are coupled to the drain of the first transistor;
a seventh transistor having a gate configured to receive the negative voltage of the differential reference voltage, wherein a source and a drain of the seventh transistor are coupled to the drain of the second transistor; and
an eighth transistor having a gate configured to receive the positive voltage of the differential reference voltage, wherein a source and a drain of the eighth transistor are coupled to the drain of the first transistor.

19. A method for analog-to-digital conversion, comprising:
- tuning, via a calibration circuit, a reference voltage for each of a plurality of comparators of a flash analog-to-digital converter (ADC) coupled to the calibration circuit;
- performing, via the flash ADC, the analog-to-digital conversion after the tuning of the reference voltages, the analog-to-digital conversion being performed by comparing an input voltage to the reference voltage by each of the plurality of comparators;
- setting, for each of the plurality of comparators, the input voltage to a trigger point to be configured for the comparator; and
- performing, via the comparator, multiple comparisons of the input voltage with the reference voltage while the input voltage is set to the trigger point, wherein the tuning of the reference voltage for the comparator is based on results of the multiple comparisons.

20. The method of claim 19, wherein tuning the reference voltage comprises:
- increasing the reference voltage if more than half of the results of the multiple comparisons are logic high; or
- decreasing the reference voltage if less than half of the results of the multiple comparisons are logic high.

* * * * *